United States Patent [19]
Lee et al.

[11] Patent Number: 5,189,367
[45] Date of Patent: Feb. 23, 1993

[54] MAGNETORESISTOR USING A SUPERLATTICE OF GAAS AND ALGAAS

[75] Inventors: Mark Lee, Bridgewater; Stuart A. Solin, Princeton Junction; Peter A. Wolff, Princeton, all of N.J.

[73] Assignee: NEC Research Institute, Inc., Princeton, N.J.

[21] Appl. No.: 796,709

[22] Filed: Nov. 21, 1991

[51] Int. Cl.$^5$ .............................. G01R 33/06
[52] U.S. Cl. .................... 324/252; 338/32 R; 257/661
[58] Field of Search ............... 324/251, 252, 249, 260, 324/261, 235; 357/4, 16, 27; 338/32 R, 32 H

[56] References Cited

U.S. PATENT DOCUMENTS

| | | | |
|---|---|---|---|
| 3,487,301 | 12/1969 | Gardner et al. | 357/27 X |
| 4,010,486 | 3/1977 | Suzuki | 357/27 X |
| 4,032,953 | 6/1977 | Suzuki | 357/27 X |
| 4,163,237 | 7/1979 | Dingle et al. | 357/16 |
| 4,591,889 | 5/1986 | Gossard et al. | 357/16 X |
| 4,723,250 | 2/1988 | Ohkawa et al. | 357/27 X |
| 4,857,974 | 8/1989 | Patillou et al. | 357/27 X |
| 4,912,451 | 3/1990 | Sugiyama et al. | 324/252 X |
| 4,926,226 | 5/1990 | Heremans et al. | 357/27 |
| 4,939,456 | 7/1990 | Morelli et al. | 357/27 X |

Primary Examiner—Gerard R. Strecker
Assistant Examiner—Warren S. Edmonds
Attorney, Agent, or Firm—Arthur J. Torsiglieri

[57] ABSTRACT

A superlattice comprising alternating layers of undoped GaAs and silicon doped $Al_{0.3}Ga_{0.7}As$ is used as a magnetoresistor for measuring magnet fields in excess of one Tesla. The magnetic field to be measured is passed vertically through the superlattice and current from a source of constant current is flowed vertically through the resulting superlattice and the voltage drop across the superlattice is measured to provide an indication of the strength of the magnetic field.

7 Claims, 1 Drawing Sheet

MAGNETORESISTOR USING A SUPERLATTICE OF GAAS AND ALGAAS

INTRODUCTION

This invention relates to the measurement of strong magnetic fields and more particularly to devices that depend on magnetoresistive effects for making such measurements and methods for such measurements.

BACKGROUND OF THE INVENTION

In recent years, because of the availability of superconducting magnets there has been increasing interest in strong magnetic fields, for example, magnetic fields in excess of one Tesla, that are easily obtained with such magnets. This in turn has created a need for detectors for convenient measurement of such strong fields. An ideal detector should have a number of characteristics. It should be simple to use and relatively inexpensive. It should be small so that it can be used as a probe to permit a high degree of spatial resolution of magnet flux, as is necessary when one wishes to plot accurately the field distribution associated with a particular magnetic structure. It should also have a high sensitivity, that is relatively independent of temperature over a wide range. While specific detectors are available that have one or more of these characteristics, in none are all these characteristics present to the extend desired.

In a paper published in IEEE Transections on Electron Devices Vol. 36, No. 9 September 1989 pps. 1639-1643, entitled "Highly Sensitive Split Contact Magnetoristor with AlAs/GaAs Superlattice Structures", there is described a modulation-doped AlAs/GaAs superlattice grown on a semi-insulating GaAs substrate that was provided with a first electrode at one surface and a split electrode at the other surface to form essentially a pair of parallel electrodes. The device is positioned so that the magnetic field extends through the superlattice parallel to the planes of the alternating layers. The Hall effect then creates a difference between the currents flowing in the two spaced electrodes and this difference is related to the strength of the magnetic field. This detector was described as effective to measure magnetic fields up to an intensity of about one Tesla. In this structure, the sensitivity increased with the thickness of the superlattice, decreased with the cross-section of the superlattice, and decreased with the separation of the two split contacts. The need for the split contact tends to make it difficult to achieve an especially small cross sectional area for the superlattice, as is generally desirable for fine resolution of any spatial distribution of the measured field. Also the detection of differential currents adds to circuit complexity. The present invention provides a detector of better characteristics in these respects.

SUMMARY OF THE INVENTION

We have discovered that a GaAs/AlGaAs superlattice comprising alternate layers of undoped GaAs and layers of silicon-doped AlGaAs serves as a highly sensitive magnetoresistor, particularly at magnetic fields above one Tesla. The sensitivity increases approximately as the square of the magnetic field intensity, so that the sensitivity is especially high at magnetic fields in excess of two Teslas. Moreover, the sensitivity is relatively independent of temperature over a wide range of temperatures from 0.1 degree Kelvin up to room temperature. This device can use a relatively small active element that is well adapted for use as a probe with insignificant effect on the magnetic field being measured, particularly since it can be essentially free of magnetic materials apt to distort the magnetic fields.

DETAILED DESCRIPTION OF THE INVENTION

Figure 1:
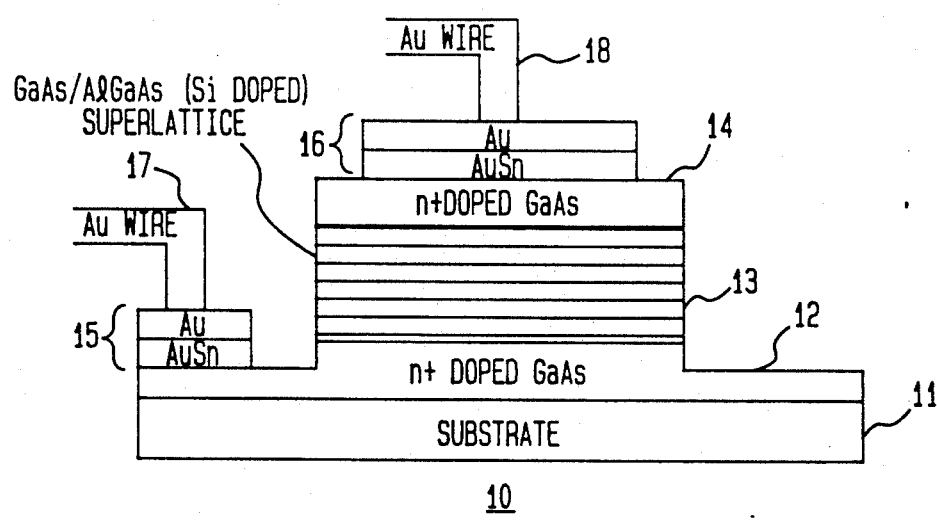
FIG. 1 shows the basic two terminal form of a magnetic field detector in accordance with the invention.

FIG. 1 shows in cross section a heterojunction structure 10 that incorporates a superlattice for use as a magnetic field detector. Basically, it comprises a substrate portion 11 that typically is an undoped gallium arsenide crystal with a [100] crystal orientation and is large enough to facilitate handling. Over the top surface of this substrate extends a heavily doped n-type epitaxially grown layer of GaAs 12, typically of one micron thickness, that serves as one contact layer for the superlattice.

On this contact layer, there is deposited a superlattice consisting of a stack 13 of thin layers, alternately a layer of undoped gallium arsenide and a layer of silicon-doped $Al_{0.3}Ga_{0.7}As$. Advantageously, there should be at least about twenty layers of each.

Doping levels of between $5 \times 10^{16}$ and $5 \times 10^{17}$ silicon atoms per cubic centimeter in the aluminum gallium arsenide were found advantageous. The choice of silicon as the dopant is favorable to achieve insignificant migration of dopant in the crystal, so that the gallium arsenide layers of the superlattice can be kept essentially free of the dopant ions and so remain dependent for conduction primarily on charge carriers tunneling in from the doped aluminum gallium arsenide layers. Others dopants should also be useful.

Advantageously, all the GaAs layers have the same thickness, typically between 20 and 80 Angstroms, and all the AlGaAs layers have the same thickness, typically between 80 and 20 Angstroms, so that the thickness of a pair of layers is about 100 Angstroms. Other thicknesses for a pair of layers within the range of 50 Angstroms to 500 Angstroms should be usable.

The specific ratio of aluminum to gallium indicated is the optimum for avoiding lattice mismatch, which is best kept to a minimum. Some variation from the optimum is tolerable. The thicknesses of the gallium arsenide and aluminum gallium arsenide layers should be sufficient to include enough lattice periods that the marginal error expected in achieving a precise number of lattice periods repeatedly is not a significant fraction of the desired periodicity. Using conventional deposition methods a minimum thickness of about 25 Angstroms is needed to achieve a high level of uniformity in fifty cells. The thickness of the aluminum gallium arsenide layers should not be excessive since this will pose too difficult a barrier for penetration by the electrons that collect in the quantum wells formed in the gallium arsenide layer. Typically, this may happen for thicknesses greater than 100 Angstroms.

A highly doped n-type gallium-arsenide about one half a micron thick 14 is grown over the top surface of the superlattice to serve as the other electrical contact layer of the device.

Typically, these layers have been grown with lateral dimensions coextensive with that of the substrate and the stack formed as a mesa of reduced cross-section by etching away a portion of the superlattice to leave a shoulder or shelf portion of the layer 12 to which an electrode 15 can be provided as one terminal of the device. The mesa can have any convenient cross section and typically may have a lateral dimension of about 100 square microns or less. The gallium arsenide layers act as quantum wells and the aluminum gallium arsenide layers serve as barriers.

In the two terminal device a separate contact 15, 16 is made to each of the heavily doped contact layers. Typically, to provide a low resistance ohmic contact it is advantageous to deposit a gold-tin, or equivalent, alloy layer followed by a gold layer and to bond a gold wire 17, 18 to the gold layer to serve as the connection lead. For operation, a voltage source (not shown) is applied between the two leads to induce current flow vertically through the stack. Then the current measured is an indication of the resistance of the superlattice, and in turn of the strength of the magnetic field. When the magnetic field is applied perpendicular to the plane of the layers, i.e. parallel to the direction of current flow through the stack, the magnetoresistance effect is positive and quite large, increasing as the square of the field intensity, and is relatively independent of temperature from about 0.1 degrees Kelvin to at least room temperature.

A factor that is sometimes undesirable in a two terminal embodiment of this kind is that the resistances of the leads and the contacts are in the series path of the current measured and these can affect the measurements undesirably. To minimize the effect of the lead and contact resistances, four point electrical measurements can be used.

Figure 2:
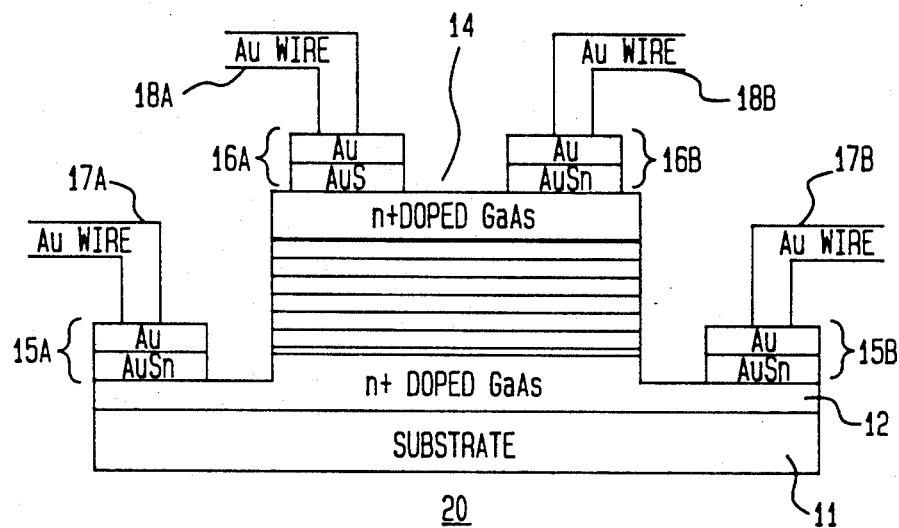
FIG. 2 shows a four terminal or four point form of a magnetic field detector in accordance with the invention.

FIG. 2 shows a modified version 20 of the heterostructure shown in FIG. 1 to adapt it for four point measurement. In this version two separate electrodes 15A, 15B are provided to the doped layer 12 and two separate electrodes 16A and 16B to the doped layer 14. Electrodes 15A and 15B are provided with leads 17A and 17B, respectively. Electrodes 16A and 16B are provided with leads 18A and 18B, respectively.

Figure 3:
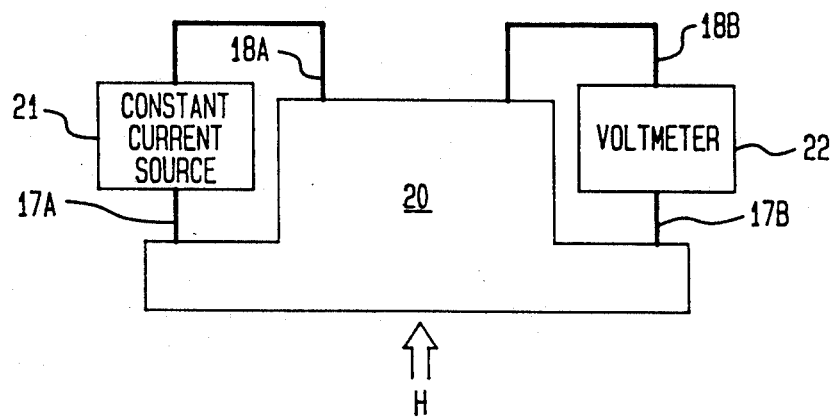
FIG. 3 shows the magnetic field detector of FIG. 2 connected in an appropriate circuit.

FIG. 3 illustrates how the embodiment shown in FIG. 2 would be used to measure the strength of a magnetic field H. As shown, the heterostructure 20 is positioned so that the magnetic field H passes through it parallel to the growth axis of the superlattice and normal to the planes of the superlattice. A constant current source 21 is connected between leads 17A and 18A and a voltmeter 22 is connected between leads 17B and 18B. The current source is adjusted to a level that insures that the voltage measured remains in the range below 0.5 volt. As is usual in such equipment, the actual field strength is obtained by first deriving the voltage associated with magnetic fields of known strength. The current source advantageously provides d-c current or low frequency current.

A complete theoretical explanation of the phenomena responsible for the magnetoresistive properties of the device is not currently available. Current-voltage traces imply the existence of a magnetic field dependent scattering rate. In particular, it appears to be important that the undoped gallium arsenide layers act as well behaved quantum wells and that the AlGaAs layers act as barriers that form well matched interfaces with the gallium arsenide layers.

It is to be appreciated that the specific embodiment described is merely illustrative of the general principles of the invention. Various possible modifications thereof will be obvious to a worker skilled in the art without departing from the spirit and scope of the invention. Moreover, it should be noted that the heterostructure described normally would be housed in a package. In this instance, since the heterostructure is to be used as a magnetic detector, the package should be designed to minimize magnetic shielding of the heterostructure from the magnetic fields passing vertically through the heterostructure.

What is claimed is:

1. Apparatus for determining the strength of a strong magnetic field comprising,
   a superlattice consisting of a plurality of lattice matched layers alternately of gallium arsenide essentially undoped and of aluminum gallium arsenide including a dopant, the superlattice including at least twenty pairs of layers,
   means including a pair of contact end layers on opposite end surfaces of the superlattice for flowing current vertically through the superlattice, and
   means connected between the pair of contact layers for measuring the resistance of the superlattice between the pair of contact layers as the magnetic field to be measured is passed through the superlattice parallel to the current flow, the value of the resistance serving as a measure of the magnetic field.

2. The apparatus of claim 1 in which the means for flowing current through the superlattice includes a constant current source and the means for measuring the resistance is a means for measuring the voltage drop across the superlattice in response to the current provided by the constant current source.

3. The apparatus of claim 1 in which the dopant in the aluminum gallium arsenide layers is silicon having a concentration between $5.0 \times 10^{16}$ and $5.0 \times 10^{17}$ atoms per cubic centimeter.

4. The apparatus of claim 3 in which the superlattice consists of at least fifty pairs of layers, and each pair is about 100 Angstroms thick.

5. The apparatus of claim 1 in which the aluminum gallium arsenide layer has a ratio of about 3 parts aluminum to 7 parts gallium, the silicon concentration in the layer is between $5.0 \times 10^{16}$ and $5.0 \times 10^{17}$ atoms per cubic centimeter, the sum of the thickness of a pair of adjacent layers is about 100 Angstroms, and the superlattice includes about fifty such pairs of layers.

6. The process for measuring a magnetic field in excess of one Tesla by measuring the magnetoresistance change resulting from the magnetic field that comprises
   passing the magnetic field to be measured parallel to the growth axis of a superlattice consisting of at least forty layers alternately of undoped gallium arsenide and doped aluminum gallium arsenide,
   passing concurrently a constant current vertically through the superlattice and parallel to the magnetic field,
   and measuring the voltage drop across the superlattice resulting from the constant current therethrough to provide a measure of the magnetoresistance change resulting from the magnetic field and so indirectly the strength of the magnetic field.

7. The measurement process of claim 6 in which the layers of aluminum gallium arsenide are doped with silicon to a concentration of between $5.0 \times 10^{16}$ and $5.0 \times 10^{17}$ atoms per cubic centimeter and includes about three parts aluminum to seven parts gallium.

* * * * *